United States Patent
Niwa et al.

(10) Patent No.: US 6,798,708 B2
(45) Date of Patent: Sep. 28, 2004

(54) MEMORY CONTROLLER AND SERIAL MEMORY

(75) Inventors: Akimasa Niwa, Toyoake (JP); Takayuki Aono, Toyoake (JP); Takuya Harada, Kariya (JP)

(73) Assignee: Denso Corporation, Kariya (JP)

(*) Notice: Subject to any disclaimer, the term of this patent is extended or adjusted under 35 U.S.C. 154(b) by 81 days.

(21) Appl. No.: 10/351,311

(22) Filed: Jan. 27, 2003

(65) Prior Publication Data

US 2003/0142570 A1 Jul. 31, 2003

(30) Foreign Application Priority Data

Jan. 30, 2002 (JP) ........................................ 2002-021971

(51) Int. Cl.[7] ................................................ G11C 7/00
(52) U.S. Cl. .................... 365/221; 365/195; 365/233; 710/260; 713/601
(58) Field of Search ............................... 365/221, 195, 365/233; 710/260; 713/601

(56) References Cited

U.S. PATENT DOCUMENTS 5,243,561 A * 9/1993 Yamauchi
5,253,214 A * 10/1993 Herrmann .................. 365/233
6,011,741 A * 1/2000 Wallace et al. ............. 365/221

FOREIGN PATENT DOCUMENTS

| JP | A-61-5498 | * | 1/1986 |
| JP | A-62-75852 | * | 4/1987 |
| JP | A-5-120144 | * | 5/1993 |
| JP | A-8-203290 | * | 8/1996 |

* cited by examiner

Primary Examiner—Richard Elms
Assistant Examiner—N. Nguyen
(74) Attorney, Agent, or Firm—Posz & Bethards, PLC

(57) ABSTRACT

In a memory controller, a serial data including an instruction bit train with addition of a start bit, a clock signal, a chip enable signal, and a reset signal are inputted. During the active period in which the chip enable signal is being inputted, the serial data is stored depending on the clock signal and an enabling signal is generated based on the end timing of active period. Thereby, memory access is executed depending on contents of the instruction bit train. However, when the relevant apparatus is reset during the active period, generation of the enabling signal based on the end timing of the active period is inhibited.

7 Claims, 8 Drawing Sheets

MEMORY CONTROLLER AND SERIAL MEMORY

CROSS REFERENCE TO RELATED APPLICATION

This application is based on and incorporates herein by reference Japanese Patent Application No. 2002-21971 filed on Jan. 30, 2002.

FIELD OF THE INVENTION

The present invention relates to a memory controller for controlling a memory by utilizing serial data.

BACKGROUND OF THE INVENTION

An EEPROM (Electrically Erasable and Programmable Read Only Memory) is known as a non-volatile memory which can electrically program new data by erasing old data. Since this EEPROM is designed small in size to easily program various data, it is widely used in a system utilizing a microcomputer for various purposes such as mode setting, storage of ID code and displacement of dip switch.

Particularly when a small amount of data is stored in this EEPROM, a serial interface is used for making access to the EEPROM. In this case, a memory controller is required for decoding a command part in serial data which has been serially inputted, converting address part and data part in the serial data to a parallel data to supply this parallel data to the EEPROM, and outputting the parallel data read from the EEPROM through conversion into the parallel data.

This memory controller is usually constructed to receive a clock signal, a chip enable signal, and a reset signal as input signals in addition to serial data; obtain, depending on a clock, the serial data supplied during an active period in which the chip enable signal is inputted; and execute access to the EEPROM depending on contents of the thus obtained serial data.

However, assuming that such a memory controller is used, if noise is superimposed on the input signal due to irregularity generated in a power source voltage or static electricity or the like, it is likely that an unexpected access (writing to non-related addresses and generation of erase instruction, etc.) to the EEPROM is executed, and various important data are destroyed. This might cause uncontrollable program execution or unrecoverable system failure.

For example, serial data '110001101100010' is considered here. This serial data is inputted for writing the data '01100010' to the address '0011' when a command expressing a write instruction is defined as '110.'

Figure 9A:
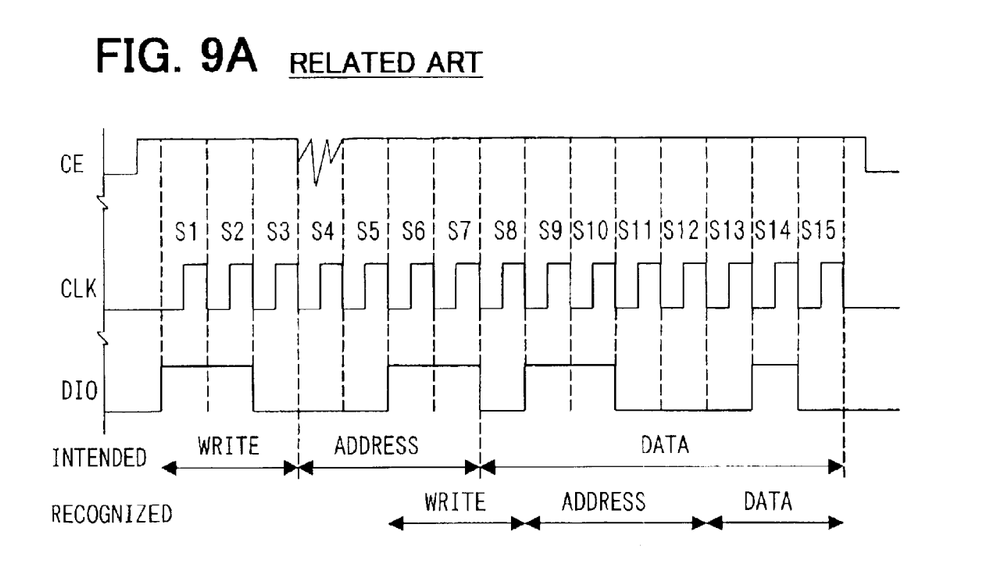
FIG. 9A is a timing diagram of the related art.

As illustrated in FIG. 9A, when noise is mixed in a chip enable signal CE in a period (slot S) corresponding to the fourth clock, a data train of the slots S1 to S3 fetched before this period is cancelled. However, since the chip enable signal CE is continuously inputted even after the influence of noise is eliminated, acquisition of data is started again. As a result, since data of the slot S6 is erroneously recognized as the leading data of serial data DIO, unexpected memory access different from expected access of a user is executed under the assumption that a write instruction (WRI) of the data '010XXXXX' to the address (ADR) '1100' is generated.

Figure 9B:
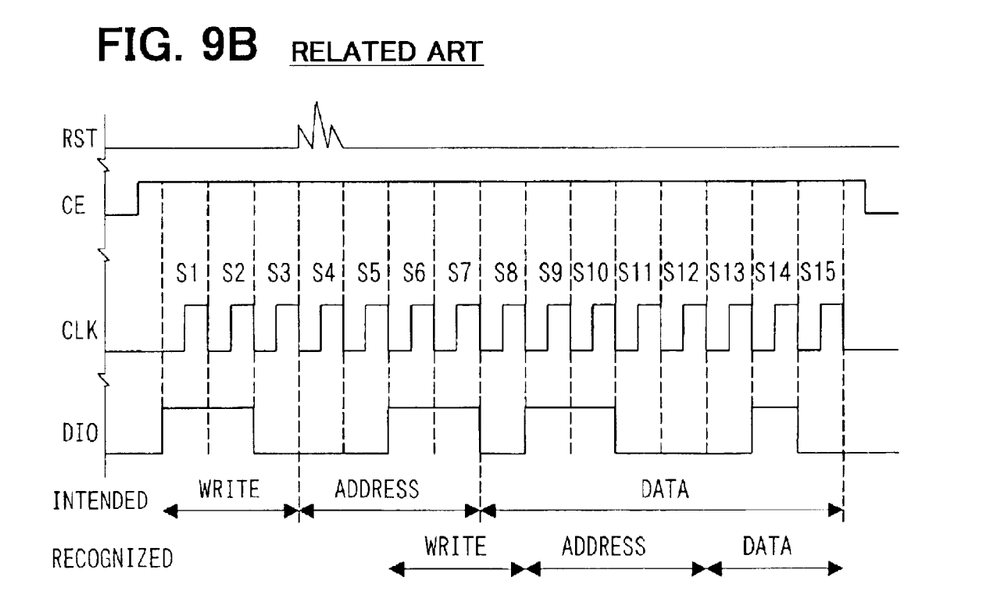
FIG. 9B is another timing diagram of the related art.

Moreover, as illustrated in FIG. 9B, when noise is also mixed in a reset signal RST, a probability of erroneous recognition of instruction also occurs as described above. It is because, since an apparatus is reset with noise mixed in the reset signal RST, a data train of slots S1 to S3 fetched before the reset is cancelled and if the chip enable signal CE is inputted continuously even after the reset by noise is eliminated, data fetch is started again.

SUMMARY OF THE INVENTION

It is therefore an object of the present invention to provide a memory controller and a serial memory which can prevent memory access which is executed due to an adverse effect of noise and is different from the access intended by a user.

In a memory controller according to the present invention, at least serial data including an instruction bit train with addition of a start bit at the beginning thereof, a clock signal synchronized to this serial data, a chip enable signal for designating the relevant apparatus, and a reset signal for resetting the relevant apparatus are inputted.

During the active period in which the chip enable signal is being inputted, the serial data is stored depending on the clock signal and an enabling signal is generated based on the end timing of active period. Thereby, memory access is executed depending on contents of the instruction bit train. However, when the relevant apparatus is reset during the active period, generation of the enabling signal based on the end timing of the active period is inhibited.

That is, it never occurs that memory access which is different from the access expected by a user is executed based on contents of the fetched serial data even if the serial data is fetched from the intermediate part because the relevant apparatus is reset when noise is mixed in the reset signal during the active period and the preceding active period is still lasted even after such a reset state is eliminated. This can surely prevents programming of contents stored in the memory to contents different from the one expected by a user based on erroneous operation caused by noise mixed in the reset signal.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The preferred embodiments of the present invention will be described with reference to the accompanying drawings.

[First Embodiment]

Figure 1A:
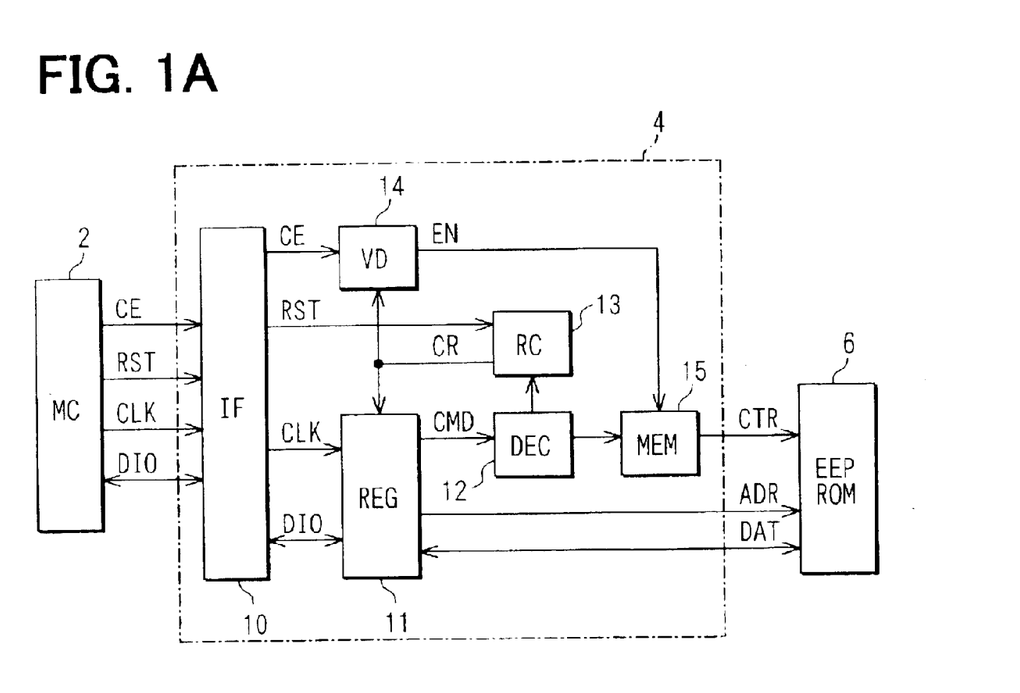
FIG. 1A is a block diagram illustrating a memory controller of a first embodiment of the present invention.

As illustrated in FIG. 1A, a memory controller 4 is provided with an interface unit 10 for inputting/outputting serial data DIO from/to a microcomputer 2 and also inputting, from the microcomputer 2, a clock signal CLK synchronized with the serial data DIO, a chip enable signal CE to designate the relevant apparatus 4, and an external reset signal RST to reset the relevant apparatus 4.

The logic level of the chip enable signal CE is high active and the period in which this high level is maintained is referred to as the active period. The logic level of the external reset signal RST is also high active.

Figure 1B:
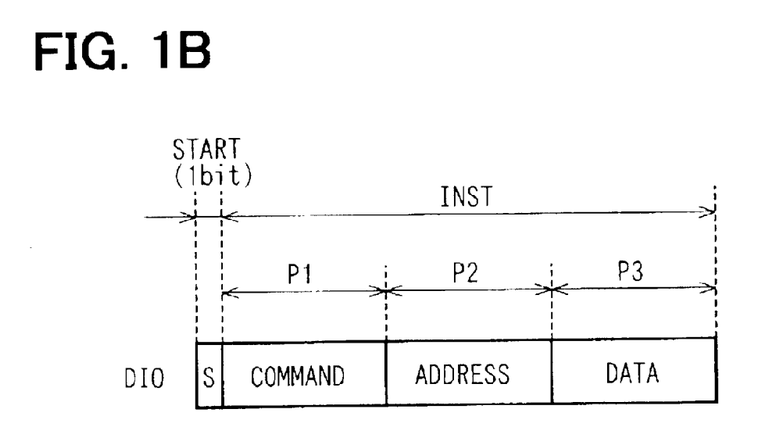
FIG. 1B is a diagram illustrating a frame format of serial data SIO in the first embodiment.

In addition, the serial data DIO has a frame format, as illustrated in FIG. 1B, where a start bit S of one bit is added at the beginning of an instruction bit train (INST) expressing contents of control for a memory (EEPROM) 6. This instruction bit train includes a first partial bit train P1 of m-bit expressing command such as a write instruction and a read instruction, a second partial bit train P2 of n-bit expressing address for designating storing position of the memory 6, and a third partial bit train P3 of p-bit expressing data to be inputted or outputted from or to the memory 6. Moreover, it is assumed here that signal level of the signal line during the radio communication is set to the low level, while signal level of the start bit S is set to the high level.

The memory controller 4 comprises: a register 11 as a serial data storing circuit for fetching serial data DI inputted via the interface 10 based on the clock signal CLK inputted in the same manner, and then outputting a parallel data through conversion process; a decoder 12 for decoding contents of the parallel data CMD corresponding to the first part bit train P1 (command) among the parallel data outputted from the register 11 and then outputting a command to each circuit depending on the decoding result; a reset controller 13 for generating an internal reset signal CR (of the low active level opposed to the level of external reset signal RST) for resetting each circuit of the relevant apparatus based on the external reset signal RST from the interface 10 and a command from the decoder 12; a validity determination section 14 for generating an enabling signal EN expressing enabling or disabling state for memory access based on the chip enable signal CE from the interface 10 and the internal reset signal CR from the reset controller 13; and a memory controller 15 as an access control circuit for generating a control signal CTR which is required for access to the memory 6 based on a command from the decoder 12 and executing the memory access when the memory access is enabled with the enabling signal EN.

The register 11 is constructed to supply, directly to the memory 6, a parallel data ADR corresponding to the second part bit train P2 (address) and a parallel data DAT corresponding to the third part bit train P3 (data).

Moreover, the decoder 12 is constructed to output a command for requesting the reset to the reset controller 13 when the memory access by the memory controller 15 is normally completed and when an error is detected at the time of decoding.

Figure 2A:
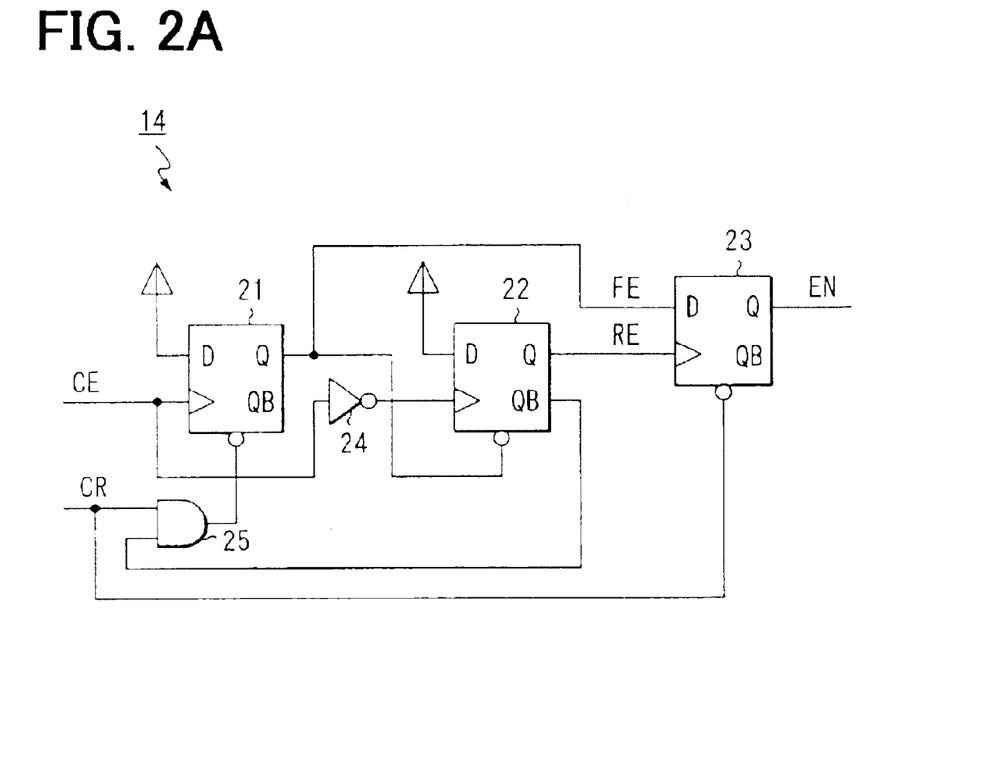
FIG. 2A is a circuit diagram illustrating a validity determination section in the first embodiment.

As illustrated in FIG. 2A, the validity determination section 14 comprises: a flip-flop (FF) circuit 21 for fixing data input in the high level and inputting the chip enable signal CE with the clock; an inverting (INV) circuit 24 for inverting the chip enable signal CE; an FF circuit 22 for fixing data input to the high level, setting a positive output of the FF circuit 21 as a reset signal, and setting an output of the INV circuit 24 as a clock input; an FF circuit 23 for setting a positive output of the FF circuit 21 as a data input, setting a positive output of the FF circuit 22 as a clock input, and setting the internal reset signal CR as a reset input; and an AND circuit 25 for inputting an inverted output of the FF circuit 22 and the internal reset signal CR and providing an output as a reset input of the FF circuit 21.

In this embodiment, the positive output of the FF circuit 21 is referred to as a rising edge detection signal FE, the positive output of the FF circuit 22 as a falling edge detection signal RE, and the positive output of the FF circuit 23 as the enabling signal EN. Moreover, the FF circuits 22, 23, INV circuit 24 correspond to an enabling signal generating circuit, while the FF circuit 21, AND circuit 25 correspond to a first inhibiting circuit.

Figure 2B:
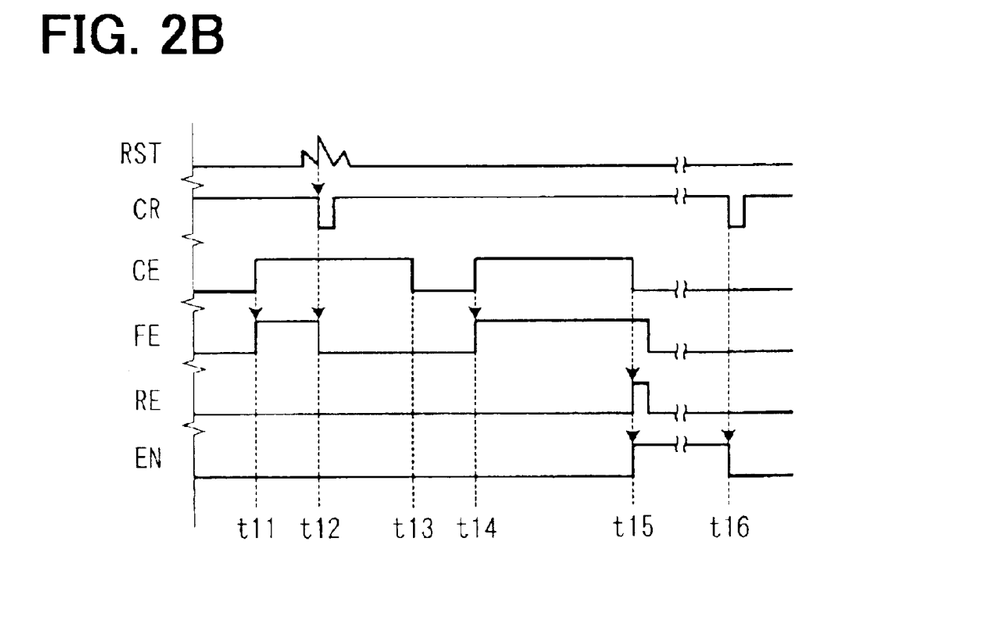
FIG. 2B is a timing diagram illustrating operations of the validity determination section.

In the validity determination section 14, the rising edge detection signal FE is shifted to high level as illustrated in FIG. 2B, when the rising edge of chip enable signal CE, namely the active period start timing, is detected (t11, t14).

Moreover, the falling edge detection signal RE is shifted to high level when the rising edge detection signal FE is in the high level, and the falling edge of chip enable signal CE, namely the active period end timing, is detected. Simultaneously, the enabling signal EN is set to high level (t15). Moreover, in this timing, since the FF circuit 21 is reset because an inverted output of the FF circuit 22 is shifted to low level, the rising edge detection signal FE changes to low level. As a result, the FF circuit 22 is also reset. Accordingly, the falling edge detection signal RE also changes to low level. Namely, the falling edge detection signal RE changes to a pulse signal.

As described above, when the enabling signal EN is set in the active period end timing, the memory controller 15 executes the memory access based on the serial data fetched by the register 11 during the active period. Here, the enabling signal EN is reset to low level with the internal reset signal CR based on the command issued from the decoder 12 at the ending time of memory access.

Moreover, when the rising edge detection signal FE is shifted to high level and the internal reset signal CR is set to low level (active) because noise is mixed in the external reset circuit RST or the like, the FF circuit 21 is reset and thereby the rising edge detection signal FE changes to low level (t12). In this case, even when the falling edge of chip enable signal CE is detected thereafter, the falling edge detection signal RE is maintained low level because the FF circuit 22 is being reset (t13). Therefore, the enabling signal EN is not reset and maintained in the low level state.

That is, if reset is generated with a certain reason during the active period, the register 11 fetches the serial data when the active period is still lasted after such reset state is eliminated. Since the enabling signal EN is not set in the active period end timing, memory access by the memory controller 15 is never executed.

As described above, according to the memory controller 4 of the first embodiment, since memory access is never executed based on erroneous data even when such erroneous data is written into the register 11 because of noise mixed in the external reset signal RST, it can surely be prevented that stored content of memory 6 is programmed to content different from that expected by a user.

[Second Embodiment]

Figure 3:
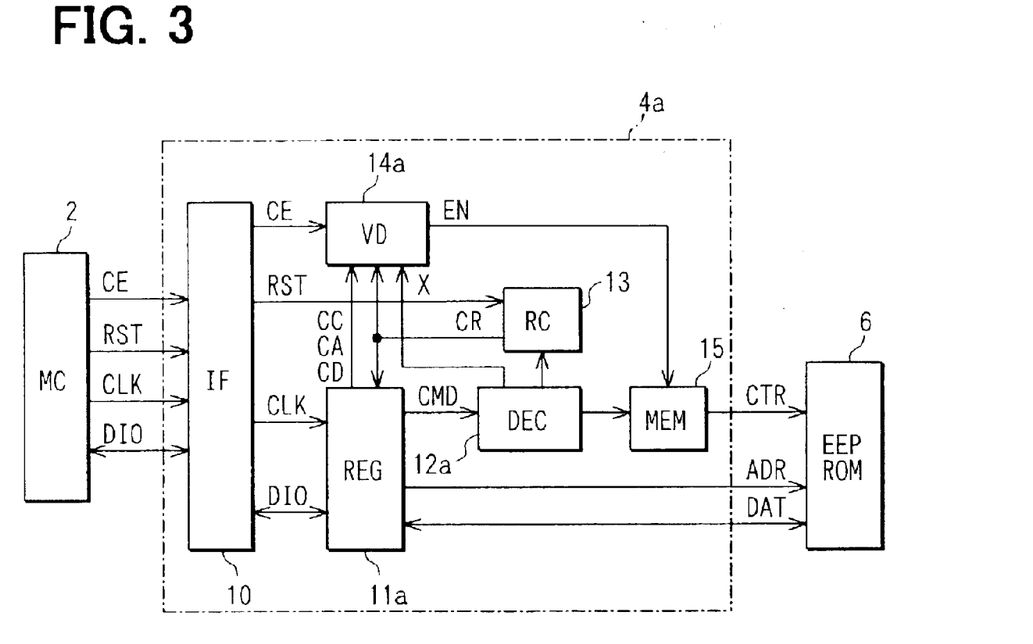
FIG. 3 is a block diagram illustrating a memory controller of a second embodiment of the present invention.

As illustrated in FIG. 3, a memory controller 4a of this embodiment is different from that of the first embodiment only with respect to a register 11a, a decoder 12a and a validity determination section 14a.

The register 11a is constructed to output storage end signals CC, CA, CD described later in addition to parallel data CMD, ADR, DAT outputted from the register 11, while the decoder 12a is constructed to output an exchange signal X generated depending on frame length determined based on content of a command in addition to the command outputted from the decoder 12. The validity determination section 14a is constructed to generate an enabling signal EN based on the storage end signals CC, CA, CD from the register 11a and exchange signal X from the decoder 12 in addition to the chip enable signal CE and internal reset signal CR.

The exchange signal X is prepared for validating only the partial bit train P1 or partial bit trains P1 and P2 or all partial bit trains P1 to P3 among the partial bit trains P1 to P3 forming an instruction bit train. For example, when a command of the serial data DIO has the content of write instruction, the exchange signal X for validating all partial bit trains P1 to P3 is generated. When a command has the content of read instruction, the exchange signal X for validating only the partial bit trains P1, P2 is generated.

Figure 4:
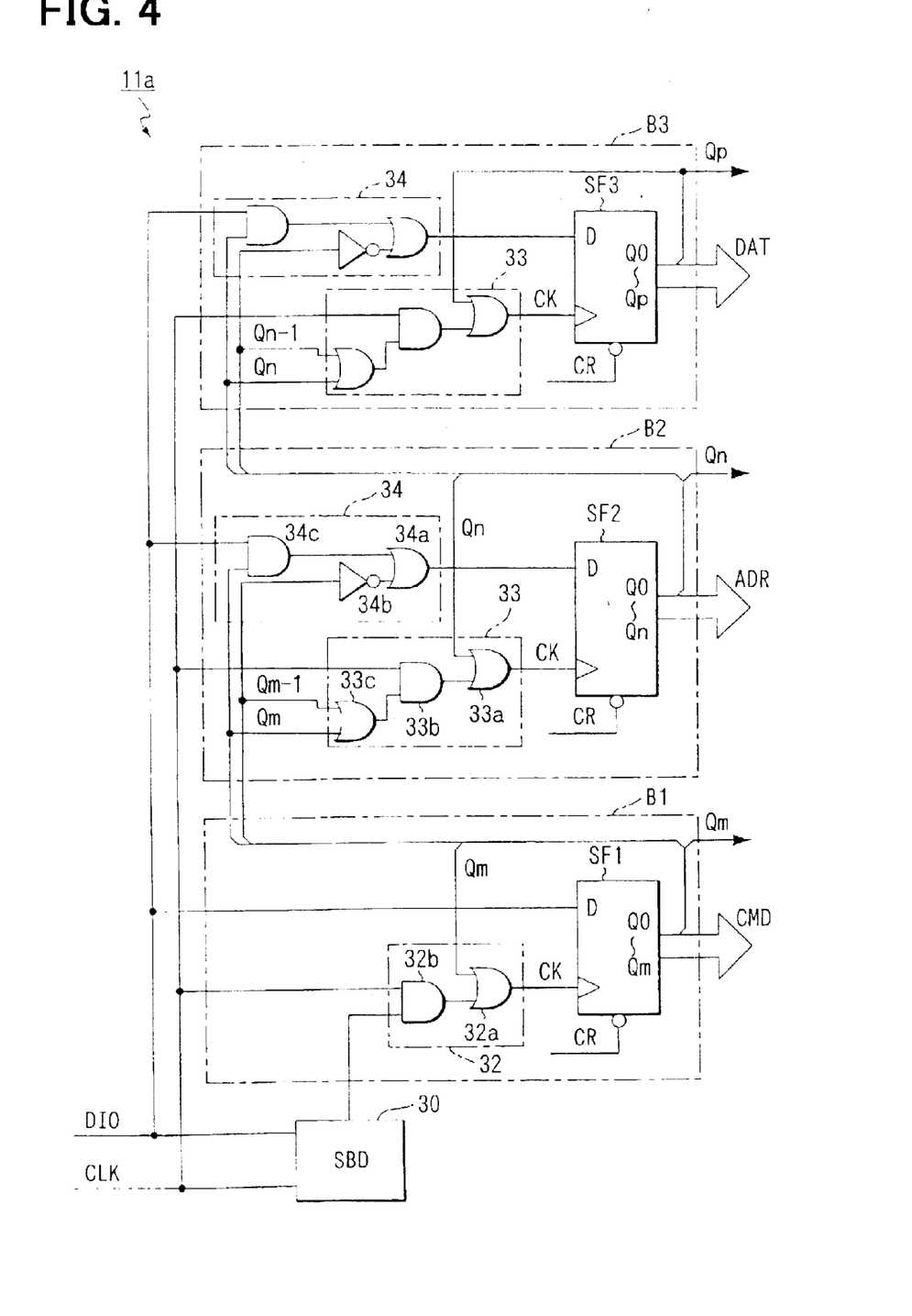
FIG. 4 is a circuit diagram illustrating a register in the second embodiment.

As illustrated in FIG. 4, the register 11a is composed of a start bit detection circuit 30 for generating a start bit detection signal STB which changes to high level when a start bit S is detected and control blocks B1 to B3 for sequentially storing the serial data DIO depending on the clock signal CLK and then outputting the stored data by respectively converting these data to parallel data CMD, ADR and DAT.

The start bit detection circuit 30 is constructed to maintain the start bit detection signal STB in the high level state until it is reset with the internal reset signal CR, when it is once set to high level.

A control block B1 comprises a shift register SF1 for storing a data of m+1 bits (Q0 to Qm) which is larger by one bit than the bit length of the partial bit train P1, and a clock supply control circuit 32 for controlling supply of an operation clock signal CK1 to operate the shift register SF1 based on the clock signal CLK, start bit detection signal STB, and the most significant bit Qm of the shift register SF1. Here, the most significant bit Qm of shift register SF1 becomes the storage end signal CC and the other m bits Q0 to Qm−1 become parallel data CMD.

The clock supply control circuit 32 is composed of an AND circuit 32b for inputting the clock signal CLK and start bit signal STB and an OR circuit 32a for generating the operation clock signal CK1 by inputting an output of the AND circuit 32b and the most significant bit Qm of the shift register SF1. Namely, the AND circuit 32b prevents, while the start bit detection signal STB is low level, that the operation clock CK1 is supplied to the shift register SF1 by masking the clock signal CLK and stops, on the other hand, supply of the operation clock signal CK1 to the shift register SF1 by masking the output of the AND circuit 32b when the most significant bit Qm of the shift register becomes high level.

In the control block B1, when an output of the shift register SF1 is reset to low level with the internal reset signal CR and thereafter supply of the operation clock signal CK1 is started with detection of the start bit S (the start bit detection signal STB is high level), the serial data DIO is sequentially stored in the shift register SF1 depending on this operation clock signal CK1. When the signal level of the most significant bit Qm changes to high level because the start bit S reaches the most significant bit Qm (m=3 in the figure), the operation clock CK1 is suspended and operation of the shift register SF1 stops. Accordingly, the first partial bit train P1 of m-bit following the start bit S is held in the shift register SF1 together with the start bit.

Figure 5:
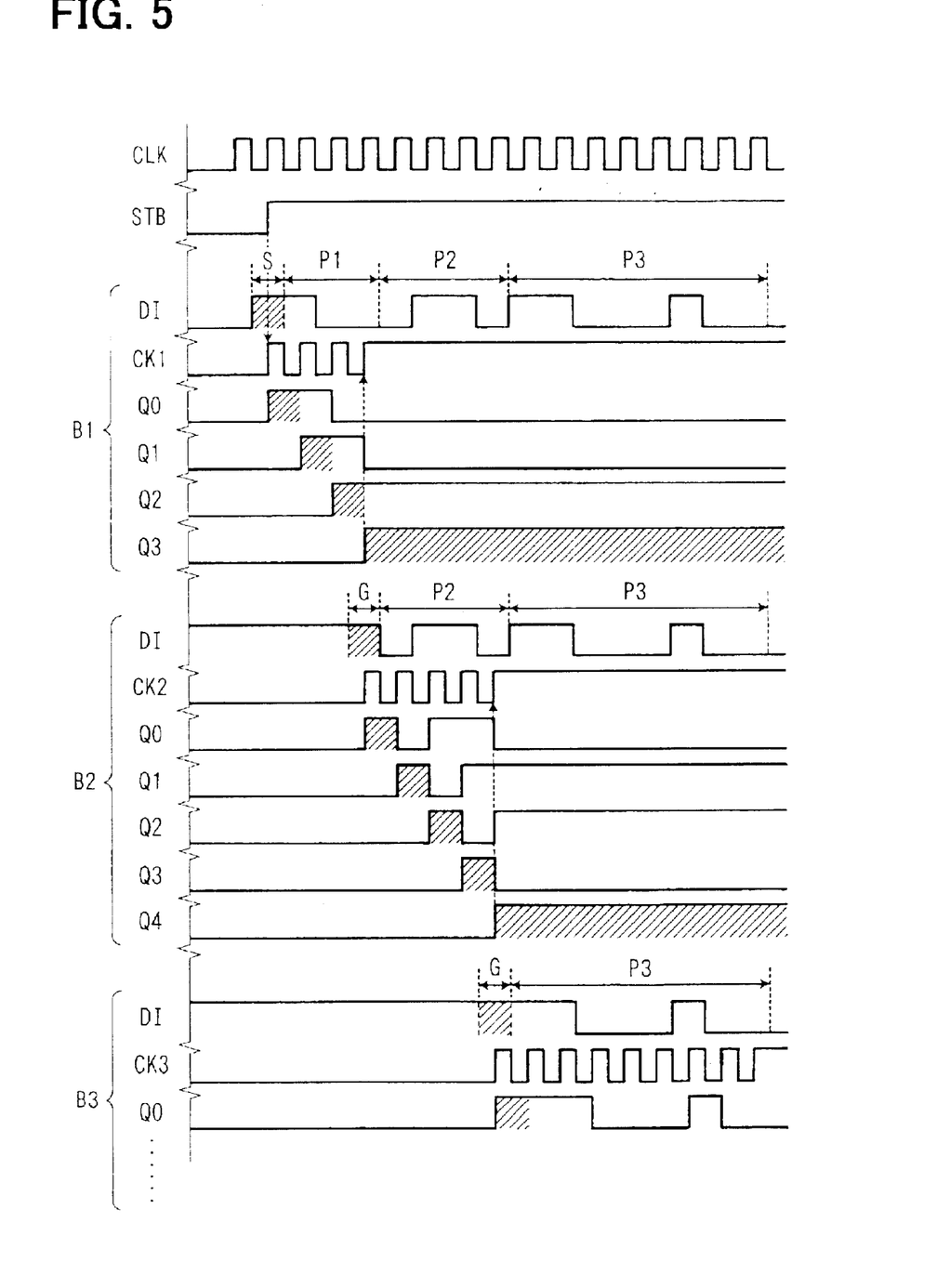
FIG. 5 is a timing diagram illustrating operations of the register.

In FIG. 5, the hatched area indicates the locations of the start bit S in the case of control block B1 and a pseudo start bit G in the case of control blocks B2, B3 which will be described later.

Next, control block B2 comprises: a shift register SF2 for storing data of n+1 bits (Q0 to Qn) which is larger by one bit than the bit length of partial bit train P2; a clock supply control circuit 33 for controlling supply of the operation clock signal CK2 to operate the shift register SF2 based on the clock signal CLK, significant two bits Qm, Qm−1 of the shift register SF1, and the most significant bit Qn of the shift register SF2; and a data supply control circuit 34 for controlling supply of the serial data to the shift register SF2 based on the serial data DIO and output Qm−1 of the shift register SF1. The most significant bit Qn (n=4 in the figure) of the shift register SF2 becomes a storage end signal CA and the other m bits become parallel data ADR.

The clock supply control circuit 33 is composed of an OR circuit 33c for inputting outputs Qm, Qm−1 of the shift register SF1, an AND circuit 33b for inputting the clock signal CLK and output of the OR circuit 33c, and an OR circuit 33a for generating an operation clock CK2 by inputting an output of the AND circuit 33b and the most significant bit Qn of the shift register SF2.

Namely, the clock supply control circuit 33 operates like the clock supply control circuit 32, except that an output of the OR circuit 33c is substituted for the start bit detection signal STB and this clock supply control circuit 33 starts supply of the operation clock signal CK2 for the shift register SF2 from the timing one bit before the start of supply of the second partial bit train P2.

The data supply control circuit 34 is composed of an inverting (INV) circuit 34b for inverting an output Qm−1 of the shift register SF1, an AND circuit 34c for inputting an output Qm of the shift register SF1 and serial data SIO, and an OR circuit 34a for supplying an output of the AND circuit 34c to the shift register SF2 when an output of the INV circuit 34b is low level.

Namely, the data supply control circuit 34 is constructed to supply the pseudo start bit G of high level to the shift register SF2 when the first operation clock signal CK2 is supplied by the clock supply control circuit 33 and thereafter to supply the serial data DIO.

In the control block B2, an output of the shift register SF2 is reset to low level with the internal reset signal CR. Then, when supply of the operation clock signal CK2 is started as illustrated in FIG. 5, the pseudo start bit G is first stored in the shift register SF2 and the serial data DIO is also stored sequentially depending on this operation clock signal CK2. When signal level of the most significant bit Qn changes to high level because the pseudo start bit G reaches the most significant bit Qn, the operation clock signal CK2 is shut off to stop operation of the shift register SF2. Therefore, the second partial bit train P2 following the first partial bit train P1 is stored in the shift register together with the pseudo start bit G.

A control block B3 is provided with a shift register SF3, which is substituted for the shift register SF2, in order to store data of p+1 bits (Q0 to Qp) which is larger by one bit than bit length of the partial bit train P3 and is constructed like the control block B2 except that: the significant two bits Qn, Qn−1 of the shift register SF2 are inputted in place of the significant two bits Qm, Qm−1 of the shift register SF1; the most significant bit Qp of the shift register SF3 becomes the storage end signal CD; and the other p bits Q0 to Qp−1 become parallel data DAT.

Accordingly, in the control block B3, the third partial bit train P3 of p bits (p=8 in the figure) following the second partial bit train P2 is stored in the shift register SF3 together with the pseudo start bit G.

When data is normally stored into the shift registers SF1 to SF3, the storage end signals CC, CA, and CD become high level.

Figure 6A:
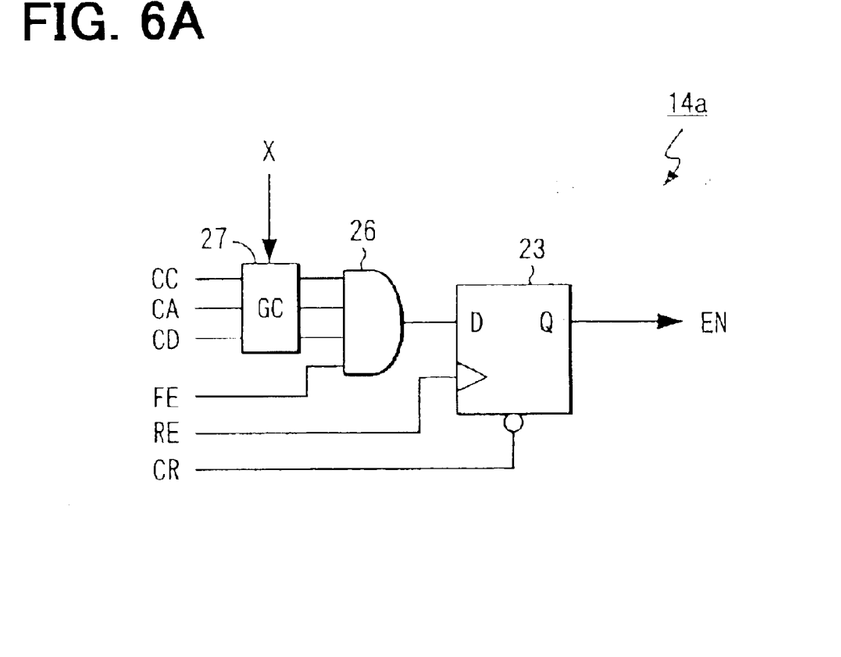
FIG. 6A is a circuit diagram of a part of a validity determination section in the second embodiment.

Next, a validity determination section 14a is different from the validity determination section 14 of the first embodiment only in that a part of the construction is added. That is, the validity determination section 14a has a construction, as illustrated in FIG. 6A, that an AND circuit 26 and a gate circuit 27 are added to the validity determination section 14. In this construction, the gate circuit 27 exchanges valid and invalid states of the storage end signals CC, CA, and CD from the register 11a depending on the exchange signal X from the decoder 12a. When these storage end signals are valid, the gate circuit 27 passes the signals. When these storage end signals are invalid, the gate circuit 27 outputs a signal of low level. When the exchange signal X indicates that the partial bit trains P1 to P3 are all valid, all storage end signals CC, CA, CD are set valid; when the signal X indicates that only the partial bit trains P1, P2 are valid, only the storage end signals CC, CA are set valid; and when the signal X indicates that only the partial bit train P1 is valid, only the storage end signal CC is set valid.

The AND circuit 26 is constructed to supply the falling edge detection signal RE to the FF circuit 23 when each output of the gate circuit 27 is high level. The AND circuit 26 and gate circuit 27 correspond to a second inhibiting means.

Figure 6B:
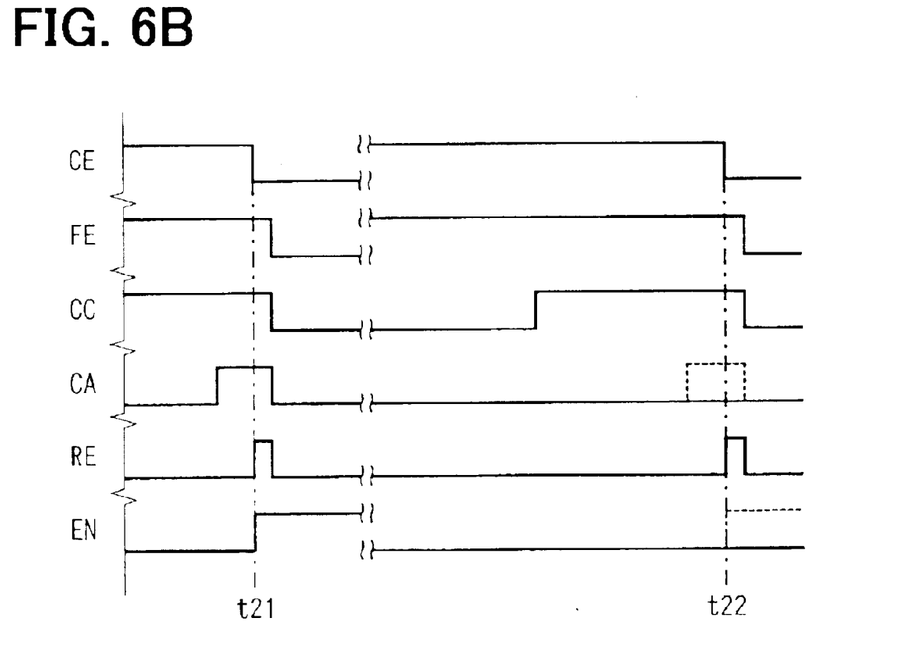
FIG. 6B is a timing diagram illustrating operations of the validity determination section.

In the validity determination section 14a, assuming that the storage end signal CD is invalidated with the exchange signal X, if the storage end signals CC, CA are high level, as illustrated in FIG. 6B, namely if the first partial bit train P1 and second partial bit train P2 are respectively stored perfectly in the shift registers SF1, SF2, the enabling signal EN is set and the memory access by the memory controller 5 is executed (t21).

Meanwhile, when the serial data SIO is fetched imperfectly to the register 11a for some reason, the corresponding storage end signal (CA in the figure) is kept under low level. Therefore, since the enabling signal EN is not set even when the falling edge detection signal RE is generated, memory access by the memory controller 15 is never executed (t22).

As described above, according to the memory controller 4a of this second embodiment, the effect similar to that of the first embodiment can be attained. Moreover it can surely be prevented that the content stored in the memory 6 is programmed again to contents not expected by a user because even if imperfect data is written into the register 11a due to the chip enable signal CE and noise mixed in the clock signal CLK, memory access based on such imperfect data is never executed.

[Third Embodiment]

Figure 7:
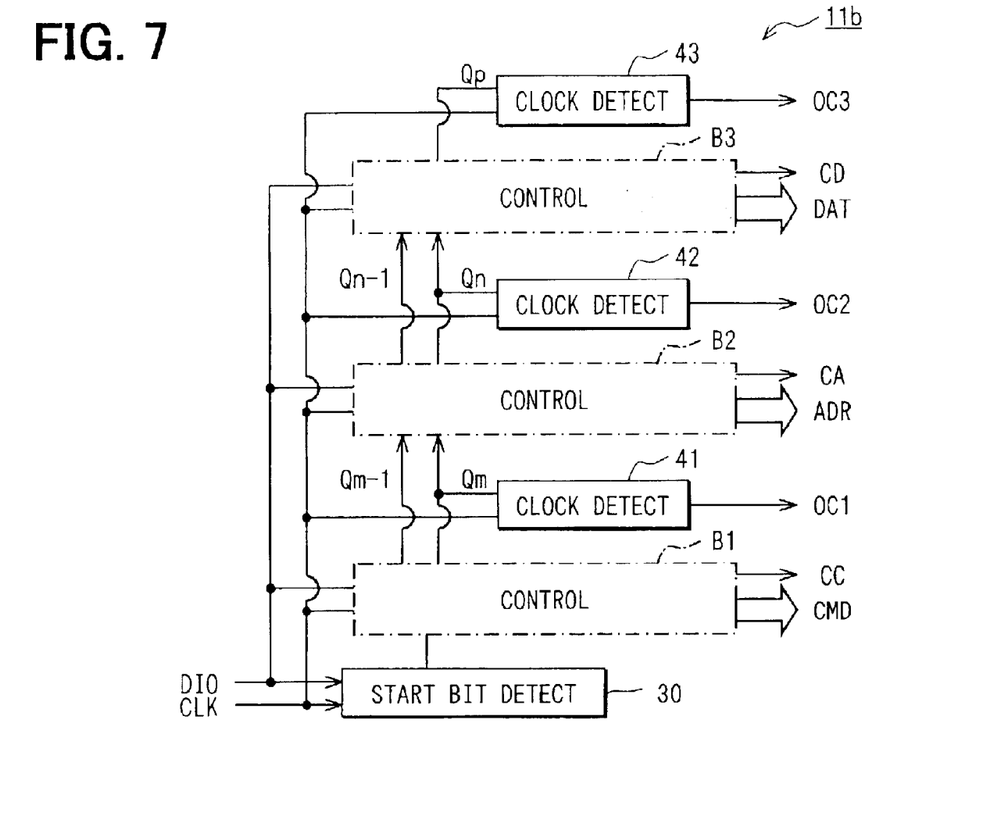
FIG. 7 is a block diagram illustrating a register of a memory controller of a third embodiment of the present invention.
Figure 8:
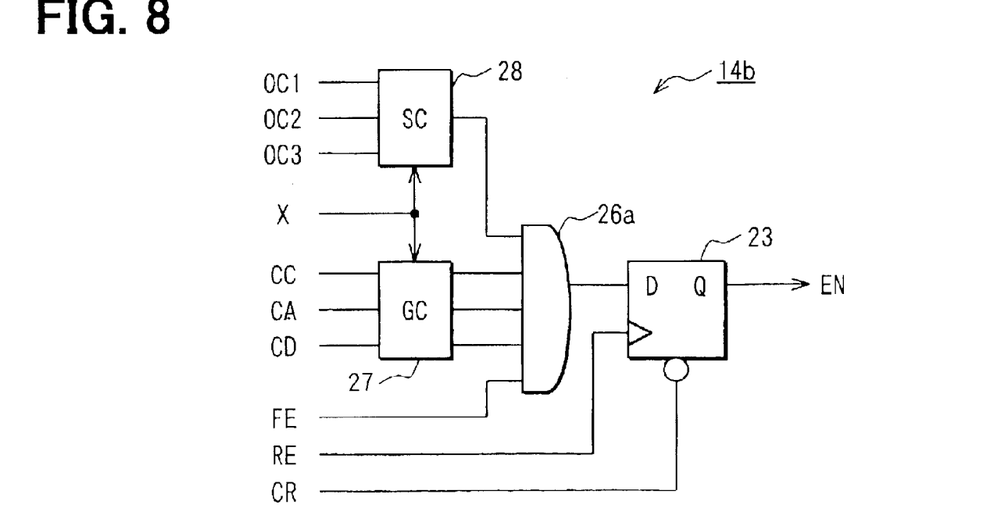
FIG. 8 is a circuit diagram illustrating a part of a validity determination section in the third embodiment.

The memory controller 4a of this embodiment illustrated in FIG. 7 is partly different in the constructions of register 11b and validity determination section 14 from that of the second embodiment.

The register 11b is provided, as illustrated in FIG. 7, with excessive clock detection circuits 41, 42, and 43 for respective control blocks B1 to B3 in addition to the construction of the register 11a of the second embodiment.

This excessive clock detection circuit 41 generates an excessive clock detection signal OC1 of high level when input of the clock signal CLK yet lasts after the most significant bit Qm becomes high level based on the most significant bit Qm of the shift register SF1 and the clock signal CLK.

In the same manner, the excessive clock detection circuit 42 (43) generates an excessive clock detection signal OC2 (OC3) of high level when input of the clock signal CLK yet lasts after the most significant bit Qn (Qp) becomes high level based on the most significant bit Qn (Qp) of the shift register SF2 (SF3) and the clock signal CLK.

Meanwhile, the validity determination section 14b is provided, as illustrated in FIG. 7, with a selector circuit 28 which selects any one of the excessive clock detection signals OC1 to OC3 from the register 11b and outputs an inverted signal thereof depending on the exchange signal X, in addition to the validity determination section 14a of the second embodiment. Moreover, an AND circuit 26a is substituted for the AND circuit 26 in order to supply the falling edge detection signal RE to the FF circuit 23 when each output of the gate circuit 27 and output of the selector circuit 28 are high level.

The selector circuit 28 is constructed to select the excessive clock detection signal OC3 when the exchange signal X indicates that the partial bit trains P1 to P3 are all valid, to select the excessive clock detection signal OC2 when only the partial bit trains P1, P2 are valid and to select the excessive clock detection signal OC1 when only the partial bit trains P1 is valid.

In the validity determination section 14b, since the enabling signal EN is not set when excessive clock CLK is supplied for storing the serial data SIO to the register 11b, memory access by the memory controller 15 is never executed.

As described above, according to the memory controller 4b of the third embodiment, the effect similar to that of the second embodiment can be attained. Moreover since memory access is never executed when it is detected that an excessive clock signal CLK is supplied with a certain reason, namely when there is probability for occurrence of erroneous operation, it can be prevented more reliably that content stored in the memory 6 is programmed again to that not expected by a user.

The present invention is never limited thereto and naturally allows various changes of modifications within the range not departing from the scope thereof.

For example, in the above embodiments, the memory controllers 4, 4a, 4b and memory 6 are constructed as individual devices but these memories can also be formed as serial memories by forming these memories with one-chip semiconductor integrated circuit. In addition, an EEPROM is used as the memory 6 but any type of memory may be used in addition to ROM and RAM when this memory allows input and output of data in unit of a plurality of bits.

What is claimed is:

1. A memory controller for controlling memories by utilizing serial data, comprising:

interface means for inputting at least serial data including an instruction bit train with addition of a start bit at the beginning thereof, a clock signal synchronized with the serial data, a chip enable signal for designating a relevant apparatus and a reset signal for resetting the relevant apparatus;

serial data storing means for storing the serial data depending on the clock signal during an active period in which the chip enable signal is inputted;

access control means for executing a memory access depending on content of the instruction bit train stored in the serial data storing means;

enabling signal generating means for generating an enabling signal to enable operation of the access control means based on the an timing of the active period; and inhibiting means for inhibiting generation of the enabling signal based on the active period end timing when the relevant apparatus is reset during the active period.

2. A memory controller according to claim 1, wherein:

the enabling signal generating means is composed of a first flip-flop circuit for generating the enabling signal in the active period end timing; and the inhibiting means is composed of a second flip-flop circuit for generating a holding signal to hold the first flip-flop circuit in the reset state during the period up to the active period start timing from the reset of the relevant apparatus.

3. A memory controller according to claim 1, further comprising:

another inhibiting means for inhibiting generation of the enabling signal when the data stored in the serial data storing means during the active period does not reach a predetermined bit length.

4. A memory controller for controlling memories by utilizing serial data, comprising:

interface means for inputting at least serial data including an instruction bit train with addition of a start bit at the beginning thereof, a clock signal synchronized with the serial data, and a chip enable signal for designating a relevant apparatus;

serial data storing means for storing the serial data depending on the clock signal during an active period in which the chip enable signal is inputted;

access control means for executing memory access depending on content of the instruction bit train stored in the serial data storing means;

enabling signal generating means for generating an enabling signal to enable operation of the access control means based on the end timing of the active period; and another inhibiting means for inhibiting generation of the enabling signal when the data stored in the serial data storing means during the active period does not reach a predetermined bit length.

5. A memory controller according to claim 4, wherein:

the instruction bit train includes a plurality of partial bit trains $P_1$ to $P_x$ respectively having a fixed bit length $M_i$ (i=1 to x);

the serial data storing means includes shift registers $SF_1$ to $SF_x$ which are provided corresponding to the partial bit trains $P_1$ to $P_x$ to store serial data of $M_i+1$ bits which is longer by one bit than the partial bit train $P_i$ to be stored depending on the clock signal, and to be initialized to an inverted signal level of a signal level of the start bit before storage of the serial data is started, clock supply control means for supplying the clock signal to the shift register $SF_i$ during a period in which signal level of the $(M_i+1)$th bit, which signal being the most significant bit of the shift register $SF_i$, changes when a predetermined start signal corresponding to the shift register $SF_i$ is inputted, start signal generating means for generating a start signal for the shift register $SF_1$ of the first stage when the start bit is detected and for generating a start signal for the shift register $SF_{j+1}$ of the next stage when signal level of the $(M_j)$th bit of the shift register $SF_j$ (j=1 to x−1), and pseudo start bit supply means for supplying, in place of the serial data, a pseudo start bit having the same signal level as that of the start bit to the shift register $SF_{j+1}$ of the next stage when the signal level of $(M_j+1)$th bit of the shift register $SF_j$ changes; and inhibiting means for determining whether the data stored in the serial data storing means has reached the predetermined bit length based on the signal level of the most significant bit of the shift registers SF1 to SFx.

6. A memory controller according to claim 4, wherein the memory controller is constructed in one-chip semiconductor integrated circuit with a serial memory which is controlled by the memory controller.

7. A memory controller according to claim 6, wherein the memory is an electrically erasable programmable read only memory.

* * * * *